United States Patent [19]

Matsui et al.

[11] Patent Number: 5,500,528
[45] Date of Patent: Mar. 19, 1996

[54] SCANNING ELECTRON MICROSCOPE

[75] Inventors: Hidenobu Matsui, Saitama; Mitsuru Hiura, Kanagawa, both of Japan

[73] Assignee: Nikon Corporation, Tokyo, Japan

[21] Appl. No.: 408,839

[22] Filed: Mar. 23, 1995

[30] Foreign Application Priority Data

Mar. 24, 1994 [JP] Japan .................. 6-053711

[51] Int. Cl.$^6$ ...................... H01J 37/256; H01J 37/244
[52] U.S. Cl. ........................... 250/310; 250/397
[58] Field of Search ..................... 250/310, 397

[56] References Cited

U.S. PATENT DOCUMENTS

| | | | |
|---|---|---|---|
| 4,596,928 | 6/1986 | Dantilatos | 250/307 |
| 4,720,633 | 1/1988 | Nelson | 250/310 |
| 4,785,182 | 11/1988 | Mancuso et al. | 250/310 |
| 4,823,006 | 4/1989 | Danilatos et al. | 250/310 |
| 4,897,545 | 1/1990 | Danilatos | 250/310 |
| 5,250,808 | 10/1993 | Danilatos et al. | 250/310 |
| 5,396,067 | 3/1995 | Suzuki et al. | 250/310 |
| 5,412,211 | 5/1995 | Knowles | 250/310 |

Primary Examiner—Jack I. Berman
Attorney, Agent, or Firm—Armstrong, Westerman, Hattori, McLeland & Naughton

[57] ABSTRACT

A sample in a sample chamber is irradiated for scanning with an electron beam emitted through a pressure limiting aperture. Secondary electrons reflected from the sample are gas amplified by gas in the sample chamber. A member defining limiting aperture serves also as an electrode, and another electrode is provided around the member. The member can move along a passage for the electron beam emitted from an electron gun by means of, for example a motor, a pinion spindle, a pinion, a rack, and a connecting member. The pressure limiting aperture is positioned close to the sample when a contact hole is observed and is positioned away from the specimen when the surface of the sample is observed.

10 Claims, 3 Drawing Sheets

SCANNING ELECTRON MICROSCOPE

BACKGROUND OF THE INVENTION

1. Field of the Invention

The present invention relates to a scanning electron microscope, and particularly to an improvement in a scanning electron microscope of the type wherein secondary electrons reflected from a specimen or sample by irradiation of primary electrons thereto are gas amplified by gas in a sample chamber.

2. Description of the Prior Arts

In a conventional scanning electron microscope, secondary electrons reflected from a specimen or sample placed within a vacuum are detected by light emission from a scintillator. In contrast, in a so-called environmental control type scanning electron microscope, secondary electrons reflected from a sample placed in a low-pressure gas such as water vapor or the like are gas magnified (electron magnified), and the gas magnified secondary electrons are directly detected by a detecting electrode. Such a scanning electron microscope of an environmental control type allows the observation of various specimens or samples such as those containing water, which cannot be observed by conventional electron microscopes. In a usual low acceleration scanning electron microscope, the quantity of primary electrons impinging on the sample is about the same as that of secondary electrons reflected from the sample. On the contrary, in the scanning electron microscope of an environmental control type, due to a relatively large acceleration voltage for an electron beam, the quantity of secondary electrons reflected from the sample tends to be smaller than that of a primary electron beam impinging on the sample. As a result, in the environmental control type electron microscope, the sample is apt to become negatively charged. The environmental control type electron microscope, therefore, needs to have means for neutralizing the negatively charged sample.

FIG. 3 is a view showing an example of a conventional scanning electron microscope of an environmental control type. A vacuum chamber 2 (in actuality, comprising a plurality of rooms which are separated from each other by partitions having an aperture, i.e. aperture plates, for differential exhaust) containing an electron gun 3 and a sample chamber 9 neighbor each other with a pressure limiting member or plate 7 having an opening or aperture 7a at the center thereof interposed therebetween. The pressure limiting apertured plate 7 is secured to a lens barrel 1 through an insulator 8. A condenser lens 4, an objective lens 6, and a deflector 5 are arranged between the electron gun 3 and the pressure limiting plate 7. Gas (e.g. water vapor) having an electron multiplying effect is supplied to the sample chamber 9 from a gas source, not shown. Pressure of the gas in the sample chamber 9 is held at about 0.1 Torr to several tens of Torr by a vacuum pump 12. The gas in the sample chamber 9 flows into the vacuum chamber 2 through the aperture 7a in the pressure limiting plate 7. However, a vacuum pump 11 maintains the vacuum chamber 2 at a lower pressure (in the state of a higher degree of vacuum) than the inside of the sample chamber 9. For example, the gas pressure of the vacuum chamber 2 is held at about $10^{-2}$ to $10^{-3}$ Torr at a position just above the pressure limiting plate 7. In actuality, the vacuum chamber 2 is divided into a plurality of rooms by members or plates defining an aperture or opening. Each room is provided with a vacuum pump, and the electron gun 3 is disposed in a room having the highest degree of vacuum. A specimen 10 or sample formed of insulator, i.e. an object of observation, is contained within the sample chamber 9.

According to the prior art, the pressure limiting plate 7 also serves as a secondary electron detector. A positive voltage relative to the sample 10 is applied to the pressure limiting plate 7 by a variable voltage source 13. A secondary electron signal obtained from the pressure limiting plate 7 is fed into a processor, not shown, through a preamplifier 14. Furthermore, a ring-like electrode 15 is provided around the pressure limiting plate 7. A positive voltage relative to the sample 10 is applied to the electrode 15 by a variable voltage source 16. A secondary electron signal obtained from the electrode 15 is fed into the processor, not shown, through a preamplifier 17.

When the specimen or sample 10 is to be observed, a primary electron beam emitted from the electron gun 3 in the vacuum chamber 2 passes through the aperture 7a in the pressure limiting plate 7 or member and focuses on the sample 10. The sample 10 is scanned by the focused electron beam. This scanning causes secondary electrons to be reflected from the sample 10. The secondary electrons receive energy from the electric field of the pressure limiting plate 7 and/or the electrode 15 and collide with the gas in the sample chamber 9 to ionize the gas. The fact that electrons obtained as a result of this ionization contribute to the magnification of the secondary electrons is gas magnification. On the other hand, the sample 10 is irradiated with positive ions generated as a result of this gas magnification. This irradiation with the primary electron beam neutralizes a negative charge generated in the sample 10. The gas magnified secondary electrons are collected by the electrode 7 serving also as a pressure limiting aperture plate and/or the electrode 15. Thus formed secondary electron signal is fed into the external processor through the preamplifiers 14, 17. Proper use of the two electrodes 15 and 7, is described below. For the observation of a usual sample, the electrode 15 having a longer migration length of secondary electrons is used (in this case, while observing a displayed image of the sample, an operator adjusts a voltage of the variable voltage sources 13, 16 in order to apply a voltage, at which the operator can observe the sample best, to the electrodes 7, 15; of course, a voltage applied to the electrode 7 may be zero in some cases). For an object requiring observation from directly above, the electrode 7 is used (in this case, while observing a displayed image of the sample, an operator adjusts a voltage of the variable voltage sources 13, 16 in order to apply a voltage to the electrodes 7, 15 so that the operator can observe the sample best; of course, a voltage applied to the electrode 15 may be zero in some cases).

The above mentioned conventional construction has a drawback that when the electrode 7 is brought closer to the sample in order to observe a contact hole under optimum conditions, the electrode 7 interferes with detection by the electrode 15. This results in degrading of a sample image, i.e. a poor observation associated with the electrode 15.

SUMMARY OF THE INVENTION

A main object of the present invention is to provide a scanning electron microscope of an environmental control type, which enables good observation of the surface of a specimen or sample and an observation of the bottom of a hole or recess formed in the specimen or sample, such as a contact hole, through the same microscope.

Another object of the present invention is to provide a scanning electron microscope of an environmental control type, wherein in a detector having radially inner and outer electrodes with respect to an axis of scanning of an electron beam, the inner electrode is adapted to be movable along the axis of scanning, thereby solving the above mentioned drawback.

A further object of the present invention is to provide a scanning electron microscope of an environmental control type, wherein the inner electrode is movably arranged in a passage for an electron beam and is moved to a desired position by a moving device provided in the passage.

In the scanning electron microscope according to the present invention, electron beams emitted from an electron gun pass through a pressure limiting aperture to enter a sample chamber. A specimen or sample in the sample chamber is irradiated with the electron beam for scanning. Secondary electrons reflected from the sample are gas magnified by gas in the sample chamber. The amplified secondary electrons are detected by a detector. The detector comprises at least an inner electrode disposed in proximity to the passage for the electron beam emitted from the electron gun and an outer electrode disposed outside the inner electrode. The inner electrode is adapted to be movable along an axis of scanning of the electron beam.

In the above mentioned scanning electron microscope, the moving device allows the position of the inner electrode to move along the passage for the electron beam emitted from the electron gun. Thus, when the bottom of a hole formed in a specimen or sample, such as a contact hole, is to be observed, the inner electrode is brought closer to the sample, thereby allowing observation at a higher SN ratio by the use of the inner electrode. When the surface of the sample is to be observed, the outer electrode allows observation at a higher SN ratio. In this observation by the use of the outer electrode, the inner electrode can be retracted to a position where it does not interfere with detection of secondary electrons by the outer electrode.

In an embodiment of the present invention, the inner electrode is movably disposed in the passage for the electron beam and is moved by the moving device provided in the passage. In another embodiment, the inner electrode also serves as the pressure limiting or apertured plate. By using the inner electrode also as the pressure limiting plate having a pressure limiting therein, the system construction becomes simple.

Figure 1:
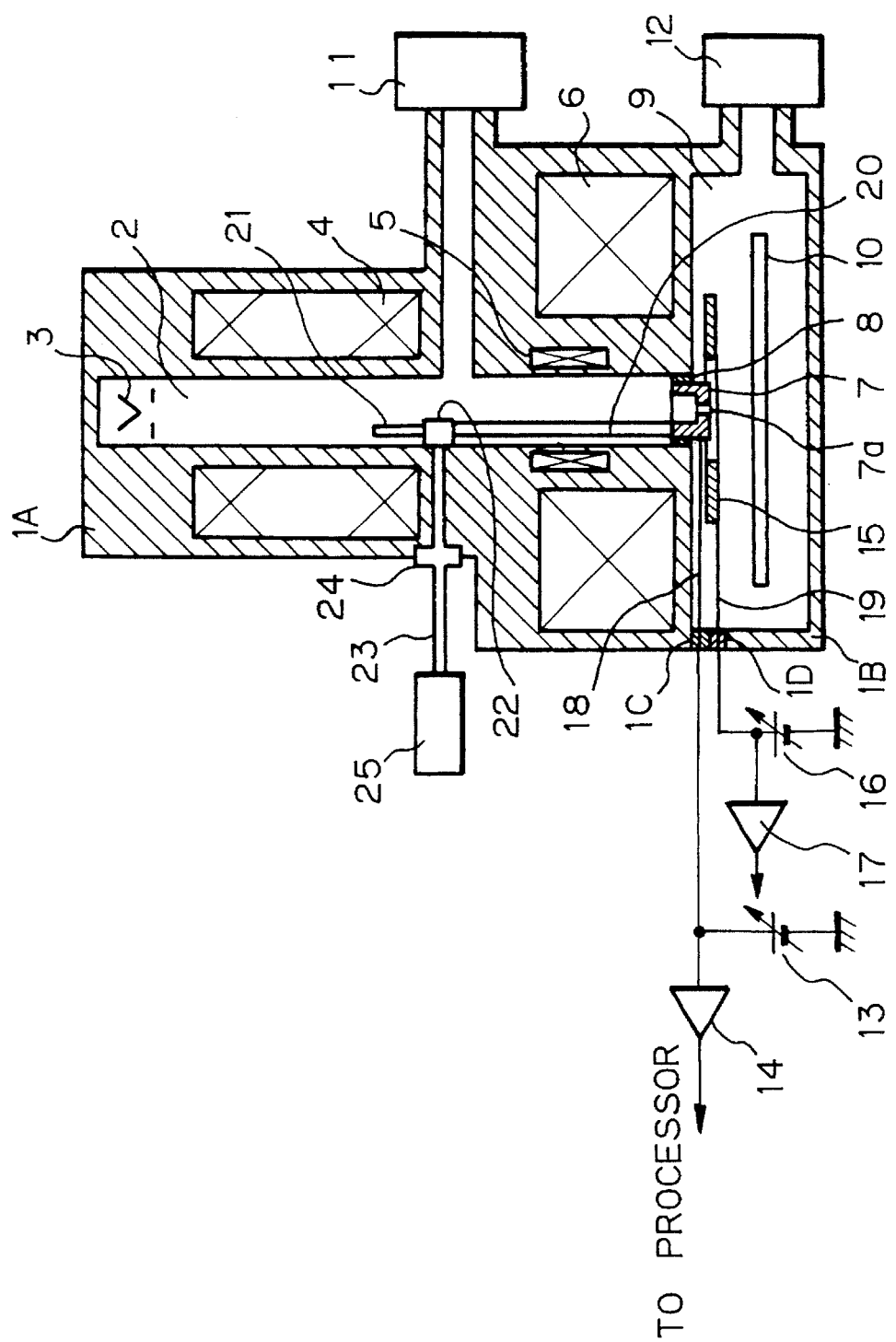
FIG. 1 is a schematic view showing a scanning electron microscope according to an embodiment of the present invention.

DESCRIPTION OF THE PREFERRED EMBODIMENTS:

FIG. 1 is a conceptual view showing a scanning electron microscope of an environmental control type according to the present invention. In FIG. 1, an electron gun 3 is disposed at the upper portion of a vacuum chamber 2 enclosed with a lens barrel 1A, a condenser lens 4 is disposed outside the vacuum chamber 2 at the intermediate portion thereof, and an electromagnetic deflector 5 is disposed outside the vacuum chamber 2 at the lower portion thereof. The vacuum chamber 2 is conceptually shown as one room. In actuality, the vacuum chamber 2 comprises, however a plurality of rooms, for example three rooms in the present embodiment, separated from each other by a plurality of pressure limiting plates or members (not shown) along the path of an electron beam. Each room is differentially exhausted by a vacuum pump. The electron gun 3 is provided in a room having the highest degree of vacuum. The vacuum chamber 2 neighbors a sample chamber 9 containing a specimen or sample 10 having an insulating property. A pressure limiting apertured member or plate 7 provided at the lower end of the vacuum chamber 2 and having an aperture or opening is interposed between the vacuum chamber 2 and the sample chamber 9. The sample chamber 9 is supplied with gas (e.g. water vapor) having a gas magnification (electron magnification) effect from a gas source, not shown. The gas in the sample chamber 9 is held at a pressure of 0.1 Torr to several tens of Torr by a vacuum pump 12. The gas leaks from the sample chamber 9 into the vacuum chamber 2 through an aperture or opening 7a in the pressure limiting plate 7. However, the gas pressure of the vacuum chamber 2 is held at a higher degree of vacuum (a smaller pressure) than the sample chamber 9 by a vacuum pump 11 (in actuality, the degree of vacuum increases room by room by differential exhaust). In the present embodiment, the pressure limiting plate 7 defining an aperture or opening 7a also serves as a secondary electron detector or inner electrode according to the present invention. A voltage which is positive with respect to the sample 10 is supplied to the pressure limiting plate or member 7 from a variable voltage source 13 through a hermetic seal 1C having an insulating property in a side wall 1B of the sample chamber 9. A secondary electron signal from the pressure limiting plate 7 is fed into a processor, not shown, through a line 18 and a preamplifier 14.

Figure 2:
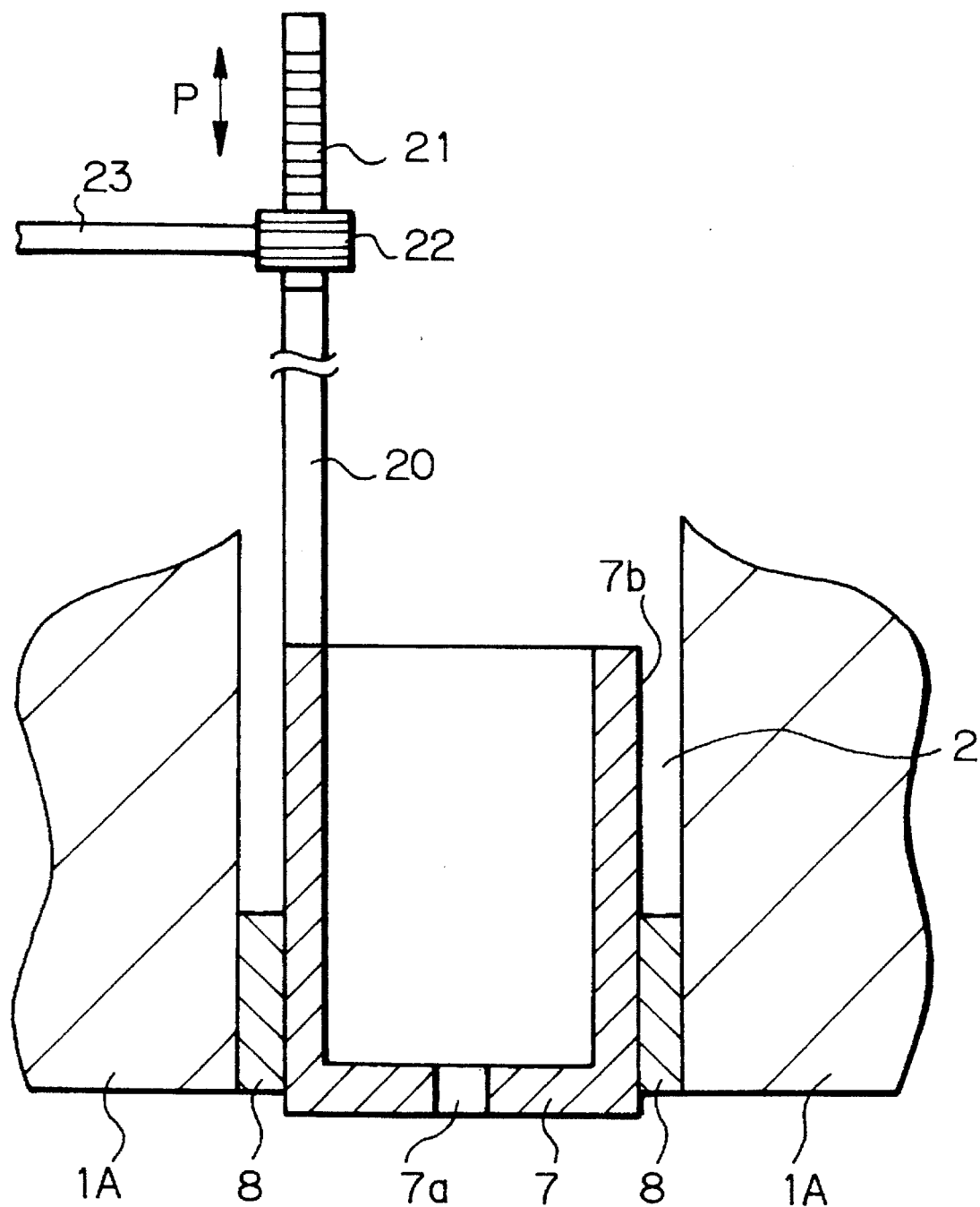
FIG. 2 is an enlarged view showing essential portions of the scanning electron microscope of FIG. 1.
Figure 3:
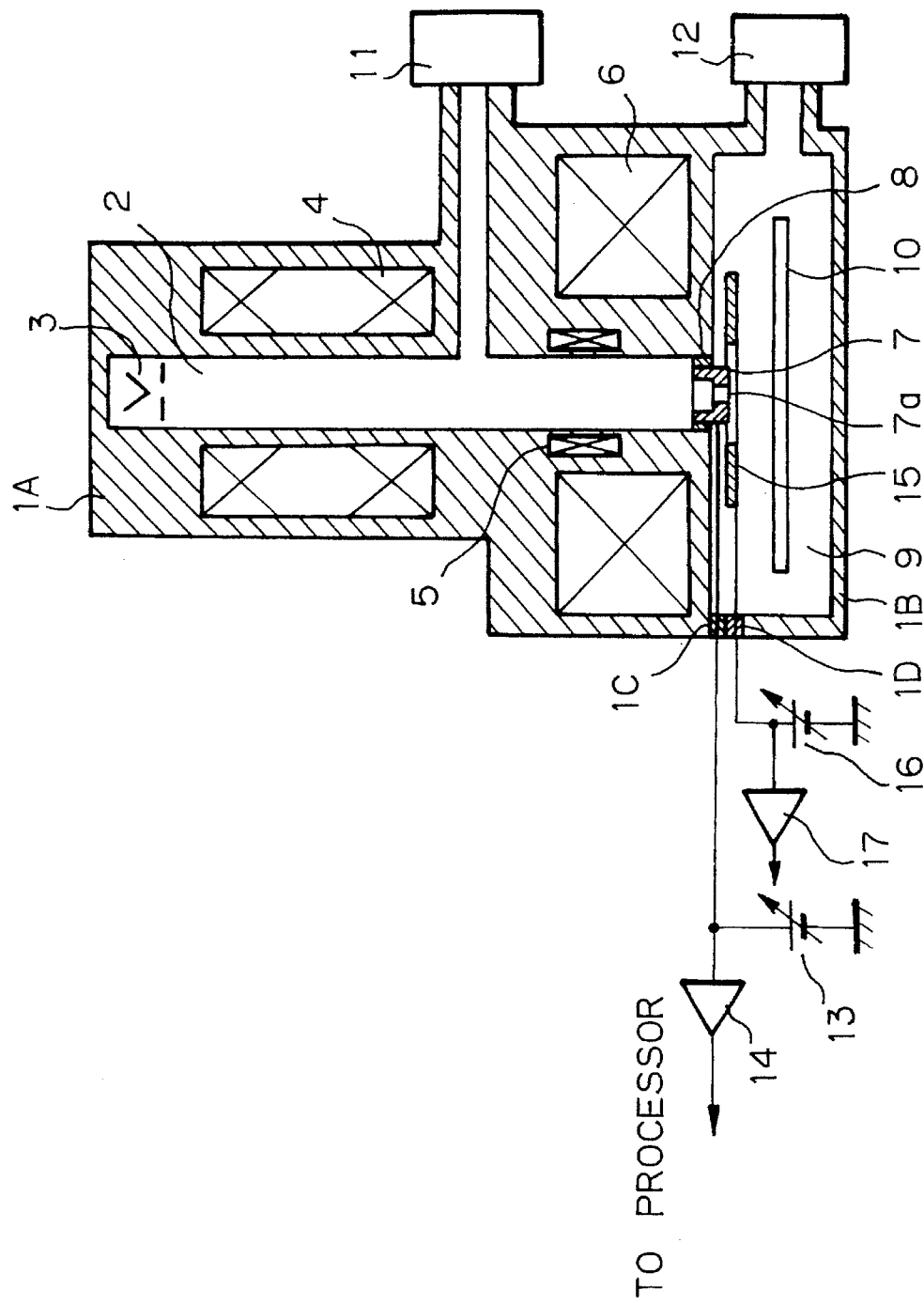
FIG. 3 is a schematic view showing an example of a conventional scanning electron microscope.

As shown in FIG. 2, a cylindrical guided surface 7b is formed on the pressure limiting plate 7. The guided surface 7b extends along the path of the electron beam. The guided surface 7b is guided along the inner surface of a cylindrical insulator 8, thereby allowing the pressure limiting plate 7 to move along the path of the electron beam. One end of a connecting member 20 is connected to the pressure limiting plate 7 at the upper end (on the side of the electron gun 3) thereof. The connecting member 20 extends upward along the inner wall of the lens barrel 1A and is provided with a rack 21 on its side near the other end thereof. As shown in detail in FIG. 2, a pinion 22 engages the rack 21. A pinion spindle 23 for revolving the pinion 22 extends through the lens barrel 1A and is led out of the lens barrel 1A through an O-ring sealed flange 24. The pinion 22 can be revolved by a motor 25 in a controlled manner. The O-ring sealed flange 24 prevents the gas from flowing along the pinion spindle 23 between the inside and outside of the lens barrel 1A. As the motor 25 revolves, the pinion spindle 23 revolves, causing the pinion 22 to revolve. This causes the rack 21 to move upward and downward along the path of the electron beam (indicated by arrow P). As a result, the pressure limiting plate 7 moves upward and downward along the path of the electron beam.

A ring-like secondary electron detector (or an outer electrode according to the present invention) 15 is disposed in such a manner as to enclose the pressure limiting plate 7. A positive voltage relative to the sample 10 is supplied to the secondary electron detector 15 from a variable voltage source 16 via a line 19 passing through a hermetic seal 1D having an insulating property in a side wall 1B of the sample chamber 9. A secondary electron signal from the secondary electron detector 15 is fed into a processor, not shown, via a line 19 passing through the hermetic seal 1C and a preamplifier 17.

Operations of the present embodiment will now be described. The electron beam emitted from the electron gun 3 is focused at the position of a deflection fulcrum of the electromagnetic deflector 5 by the condenser lens 4. Then, passing through the aperture 7a in the pressure limiting plate 7, the electron beam is again focused on the sample 10 in the sample chamber 9 by an objective lens 6. Also, the electromagnetic deflector 5 causes the electron beam focused on the sample 10 to scan over the sample 10. Electrons thus emitted from the electron gun 3 and reaching the sample 10 are referred to as primary electrons. When the sample 10 is irradiated with the primary electron beam which consists of the primary electrons, secondary electrons are reflected therefrom.

The secondary electrons can be detected by an inner secondary electron detector 7 serving also as the pressure limiting plate 7 or the secondary electron detector 15 disposed in such a manner as to enclose the pressure limiting plate 7. When the inner secondary electron detector 7 serving as the pressure limiting aperture is at an uppermost position away from the sample 10, i.e. when the secondary electron detector 7 is at a retracted position thereof, the outer secondary electron detector 15 is used. The secondary electron detector 7 is lowered from the retracted position and brought closer to the sample 10 when it is used. That is, for observation of an ordinary sample, the secondary electron detector 15 is used. The outer secondary electron detector 15 is located farther from the sample 10 than the inner secondary electron detector 7 and can be made wider in the area of detection. Hence, the secondary electron detector 15 allows a more effective utilization of gas magnification (electron magnification) effect and also can detect more electrons. A good image at a higher SN ratio (S/N), therefore, can be obtained. In a reverse point of view, because of a long travel distance of secondary electrons undergoing gas magnification, the same signal intensity (the same number of electrons) can be obtained even at a higher degree of vacuum (lower gas pressure). Thus, the scattering of primary electrons can be suppressed by a reduction in the gas pressure. However, in the case of observing the bottom of a contact hole or recess, for example, the inner secondary electron detector 7 serving also as a pressure limiting plate is used. This is because detection from directly above a contact hole provides shadow-free conditions, as viewed from a detector, with a resultant efficient detection of secondary electrons released from the bottom of the contact hole. When a contact hole in a less charged sample 10 is observed, a positive electric field is established around the contact hole as the secondary electron detector 7 is brought closer to the sample 10 and also the gas pressure is increased (lower degree of vacuum). Thus, secondary electrons can be efficiently released from within the contact hole. Accordingly, for observation of the bottom of a hole or recess formed in the sample 10, such as a contact hole, the distance between the secondary electron detector 7 and the sample 10 is changed to determine the position of the secondary electron detector 7 where the operator can observe the sample best.

To change the position of the secondary electron detector 7, the amount of revolution of the motor 25 may be electrically controlled by a controller, not shown, located outside the lens barrel 1A or the side wall 1B of the sample chamber 10. If a pulse motor is used as the motor 25, the amount of revolution can be controlled by means of the number of pulses supplied thereto. Revolution of the motor 25 causes the pinion spindle 23 to revolve. The pinion spindle 23 is inserted into the lens barrel 1A through the O-ring sealed flange 24 used for maintaining a vacuum within the lens barrel 1A. Thus, the distance between the secondary electron detector 7 and the sample 10 can be changed by moving the secondary electron detector 7 while a vacuum within the body tube is maintained.

When these operations are executed, set voltages of the variable voltage sources 13, 16 are adjusted to a value at which the operator can observe the sample best.

Needless to say, the position of the secondary electron detector 7 may be adjusted manually without controlling electrically by the motor 25. In this case the operator may manually rotate the pinion shaft 23 to move the secondary electron detector 7 along the traveling direction of an electron beam (primary electron).

The secondary electron detection signals which have been detected by the secondary electron detectors 7, 15 and gas amplified are amplified by the preamplifiers 14, 17 and then processed by the processor(s) (respectively dedicated processors may be provided for individual use, or a common processor may be provided for shared use), not shown, to display an image of the specimen 10 on a monitor, not shown.

The above description is about an advantage of using the two secondary electron detectors 7 and 15 according to objects to be observed, i.e. kinds of the sample 10. However, for some objects, the two secondary electron detectors 7 and 15 may be used concurrently, and signals obtained from the detectors 7 and 15 may be combined for observation.

Of the inner secondary electron detector 7 and the outer secondary electron detector 15, the inner secondary electron detector 7 also serves as a pressure limiting plate. However, an inner secondary electron detector may be provided independently of a pressure limiting or apertured plate. In this case, the inner secondary electron detector should be brought as close to the passage for the primary electron beam as possible. More precisely, in FIG. 1 the pressure limiting aperture is positioned at the lower end of the vacuum chamber 2 and the secondary electron detector (inner electrode) 7 is positioned in the sample chamber 9 between the pressure limiting aperture and the sample 10 in such a way that it comes as close as possible to the path of the electron beam (primary electron). Moreover, one end of the connecting member 20 extends through a partition plate (or pressure limiting aperture) between the vacuum chamber 2 and the sample chamber 9 and connected to an upper end of the secondary electron detector 7 through an O-ring sealed flange positioned in the partition plate. This O-ring sealed flange prevents the gas from flowing along the connecting member 20 between the vacuum chamber 2 and the sample chamber 9. When the pinion shaft is revolved by the motor (or a hand), only the secondary detector 7 relatively moves (moves up and down) in the traveling direction (P) of the electrode with respect to the sample.

Furthermore, the above description has taken up an example of dual secondary electron detectors with the passage for the primary electron beam as a center. However, a further secondary electron detector may be provided outside the secondary electron detector 15. The inner and outer secondary electron detectors are not necessarily shaped like a ring, but may be divided as needed.

As described above, according to the present invention, there is provided a scanning electron microscope which easily realizes a good observation of the surface of a specimen or sample and an observation of the bottom of a hole formed in the sample, such as a contact hole, through the same microscope at a high SN ratio.

What is claimed is:

1. A scanning electron microscope comprising:

an electron gun for emitting an electron beam;

a passage for the electron beam to pass through;

an electron lens disposed around said passage;

a deflection electrode for deflecting the electron beam;

a sample chamber communicating with said passage through a pressure limiting aperture and containing a sample therein;

a detector for detecting secondary electrons reflected from the sample and gas magnified by gas in said sample chamber, said detector being disposed in said sample chamber and having at least an inner electrode and an outer electrode disposed outside said inner electrode; and said inner electrode being capable of moving in opposite directions along a path of the electron beam.

2. A scanning electron microscope according to claim 1, further comprising a moving device for moving said inner electrode along the path of the electron beam.

3. A scanning electron microscope according to claim 2, further comprising a pressure limiting member defining said pressure limiting aperture, said member serving also as said inner electrode.

4. A scanning electron microscope according to claim 3, wherein said pressure limiting member has a cylindrical outer surface which is movably guided by an inner surface of a sleeve-like insulator disposed around said passage.

5. A scanning electron microscope according to claim 3, wherein said moving device comprises a connecting member connected to said pressure limiting member and extending along said passage and a pinion engaging with a rack formed on said connecting member and wherein said pinion is revolved by an electric motor provided outside said passage in order to move said pressure limiting member.

6. A scanning electron microscope according to claim 3, wherein said moving device comprises a connecting member connected to said pressure limiting member and extending along said passage and a pinion engaging with a rack formed on said connecting member and wherein said pinion is manually revolved outside said passage in order to move said pressure limiting member.

7. A scanning electron microscope according to claim 2, further comprising a pressure limiting plate defining said pressure limiting aperture, said pressure limiting plate being formed separately from said inner electrode.

8. A scanning electron microscope comprising:

a sample chamber, said sample chamber being charged with gas which magnifies secondary electrons reflected from a sample and including a first detector adapted to detect a gas magnified secondary electron beam and positioned adjacent to an electron beam directed to the sample and a second detector positioned outside the first detector; and a driving member for moving the first electron detector along the electron beam.

9. A scanning electron microscope according to claim 8, further comprising an electron gun for emitting the electron beam, a vacuum chamber for housing the electron gun and a member having an opening through which the electron beam passes, said member being disposed between the vacuum chamber and the sample chamber, and acting as an electrode for the first detector.

10. A scanning electron microscope comprising:

a chamber, said chamber including a detector having a first electrode for receiving a gas magnified secondary electrons from a sample and positioned adjacent to an electron beam directed to the sample and a second electrode positioned outside the first electrode; and a driving member for moving the first electrode along the electron beam.

* * * * *